United States Patent

Woodall

[15] 3,675,026

[45] July 4, 1972

[54] CONVERTER OF ELECTROMAGNETIC RADIATION TO ELECTRICAL POWER

[72] Inventor: Jerry M. Woodall, White Plains, N.Y.

[73] Assignee: International Business Machines Corporation, Armonk, N.Y.

[22] Filed: June 30, 1969

[21] Appl. No.: 837,755

[52] U.S. Cl. ............................250/211 J, 317/235 N, 136/89

[51] Int. Cl. ............................H01l 15/00

[58] Field of Search .............250/211, 212; 317/235; 136/89

[56] References Cited

UNITED STATES PATENTS

| | | | |
|---|---|---|---|
| 3,411,946 | 11/1968 | Tramposch | 117/201 |
| 3,436,549 | 4/1969 | Pruett | 250/211 |
| 3,445,686 | 5/1969 | Rutz | 250/211 X |
| 3,473,032 | 10/1969 | Lehovel | 250/217 X |
| 3,508,126 | 4/1970 | Newman | 317/235 |

OTHER PUBLICATIONS

Dupprecht et al: Applied Physics Letters; Vol. II, No. 3; Aug. 1, 1967 pp. 81–83

*Primary Examiner*—Walter Stolwein

*Attorney*—Hanifin and Jancin and Bernard N. Wiener

[57] ABSTRACT

The converter obtains an efficient conversion of solar electromagnetic radiation into electrical power. A p-n junction is fabricated close to an optical surface of a region of n-type GaAs which is receptive of the solar radiation. There is a window on the optical surface consisting of a window layer of $Ga_{1-x}Al_xAs$, where x is less than one and greater than zero with a composition to cause the window layer to contribute selectively to absorbing and transmitting certain components of the incoming solar radiation. The layer of $Ga_{1-x}Al_xAs$ is made nearly transparent to electromagnetic radiation and is nearly absorbent of the energetic particle radiation content of the received solar radiation. The window layer is an integral part of the procedure for forming the p-n junction. It contributes the p-type doping species to the junction by diffusion into the n-type GaAs substrate. For certain applications, the $Ga_{1-x}Al_xAs$ window can be removed by etching with aqueous solution of HCl. If the window if removed, the ohmic contact is then made to the optical surface of the p-type GaAs.

Illustratively, another structure provided by this disclosure includes a window of GaP of p-type conductivity on the surface of a region of n-type InP with a p-type transition region of InP therebetween.

6 Claims, 8 Drawing Figures

INVENTOR
JERRY M. WOODALL

BY Bernard N. Wiener
ATTORNEY

CONVERTER OF ELECTROMAGNETIC RADIATION TO ELECTRICAL POWER

BACKGROUND OF THE INVENTION

This invention relates generally to devices for conversion of radiant energy to electrical power and method for fabrication thereof, and it relates more particularly to such devices for conversion of solar electromagnetic radiation to electrical power, i.e., the provision of solar cells and their fabrication.

Although it has been recognized as desirable to utilize the semiconductor material GaAs for a converter of solar energy to electrical power, the theoretical efficiency predicted for this device has not been obtainable because of difficulty of providing a p-n junction sufficiently close to a surface receptive of the solar radiation. It has been determined theoretically that a GaAs solar cell can have approximately 25 percent conversion efficiency. Although this theoretical efficiency is greater than the theoretical efficiency for a silicon solar cell, e.g., approximately 15 percent, the latter has been developed considerably for practical uses because the problems involved have generally been satisfactorily addressed. Through the provisions of this invention, it now becomes possible to obtain approximately this theoretical efficiency for GaAs because of the nature of the inventive device and the technique by which it is produced.

A background article on solar cells is "Recent Research on Photovoltaic Solar Energy Converters," by J. J. Lofercki, Proc. of the IEEE, 1963, pp. 667 to 673.

OBJECTS OF THE INVENTION

It is on object of this invention to provide a solid state device for efficiently converting radiant energy to electrical power.

It is another object of this invention to provide a solid state device for efficiently converting electromagnetic energy to electrical power which utilizes a semiconductor material having a direct band gap, e.g. GaAs.

It is another object of this invention to provide a solid state device for converting electromagnetic radiation of solar radiation to electrical power and utilizing a semiconductor structure having a p-n junction therein and material adjacent to the junction which transmits solar radiation in the region approximately below the maximum energy of the solar spectrum and substantially precludes any high energy particle radiation from the junction, and has relatively high electrical conductivity compared with the electrical conductivity of the direct band gap semiconductor material of the preceding object.

It is another object of this invention to provide a method for establishing a p-n junction in GaAs very close to an optical surface of the GaAs by a layer of $Ga_{1-x}Al_xAs$ on the GaAs by liquid phase epitaxy and controllably doping it via diffusion from the $Ga_{1-x}Al_xAs$ layer.

It is another object of this invention to provide a method for establishing a p-n junction in a semiconductor region having a given conductivity at an optimum distance from a surface on the semiconductor region.

It is another object of this invention to provide the p-n junction of the foregoing object by growing a region of another semiconductor material on the first semiconductor material of opposite conductivity type and diffusing the conductivity type controlling dopant into the first semiconductor material to create the p-n junction at the optimum distance.

It is an object of this invention to provide a detector for electromagnetic radiation.

It is another object of this invention to provide a solid state device useful as a detector for electromagnetic radiation having an absorption limitation approximate the infrared limitation of the human eye and an absorption limitation approximate the ultraviolet limitation of the human eye.

SUMMARY OF THE INVENTION

This invention provides a converter for conversion of radiant energy to electrical power by absorption thereof in a semiconductor material wherein a p-n junction is proximate to a receptive optical surface for the radiant energy. The p-n junction is formed by controlling the depth of the junction by controlling the diffusion of the conductivity type determining dopant. In the practice of this invention, it is sometimes desirable to have a window layer of other semiconductor material on the p-n junction layer. The window layer absorbs preferentially certain components of the incident radiant spectrum and transmits preferentially other components of the incident radiation.

For a preferred embodiment of this invention, the energy conversion structure includes a region of GaAs with a p-n junction with an interface optical surface thereon to a region of $Ga_{1-x}Al_xAs$, where x is less than 1 and greater than 0.

An aspect of this invention is the method of controllably doping GaAs of a given conductivity type with a dopant of an opposite conductivity type to establish a p-n junction close to a surface of the GaAs. Illustratively, for the doping of n-type GaAs with the p-type dopant Zn, a layer of $Ga_{1-x}Al_xAs$ with Zn therein is grown by liquid phase epitaxy on n-type GaAs substrate. As the $Ga_{1-x}Al_xAs$ layer solidifies, a heterojunction is established between it and the GaAs substrate. The Zn dopant diffuses across this heterojunction to provide a p-type dopant for the GaAs. When the entire structure is used as a radiant energy detector, the property of the heterojunction does not contribute significantly to the device operation. In general, the practice of this invention provides a method for doping controllably a binary semiconductor material from a related ternary semiconductor material.

The considerations for obtaining a converter of radiant energy into electrical power for which the solution provided by the practice of this invention is approximately equivalent to an idealized solution involves several criteria. The lifetime of minority carriers should be sufficiently long for diffusion across a p-n junction and the band gap of the semiconductor material used as the detector should be of such energy as to absorb substantially all of the frequencies in the spectrum of the incident radiation. These criteria provide for an idealized solution to obtain maximum output current from a photodetector. These criteria conflict with the implementation of the criterion that the power output from a solar cell is directly related to the voltage obtained which increases with the band gap energy. In the idealized solution for a solar cell for obtaining maximum current output, the band gap energy should be small.

For maximum power output with GaAs semiconductor material, it is necessary that the p-n junction be as close as possible to the radiation receptive optical surface because the lifetime for diffusion of electron-hole pairs which are created by absorption of photons is relatively small compared to the comparable lifetime for diffusion of electron-hole pairs for Si. The window, e.g., $Ga_{1-x}Al_xAs$, should be effectively transparent to permit the desired photons to reach the p-n junction; it should have sufficient electrical conductivity to obtain the required current; and it should also provide a barrier for the cosmic rays in the solar radiation which cause radiation damage to the solar cell.

The foregoing and other objects, features and advantages of the invention will be apparent from the following more particular description of a preferred embodiment of the invention, as illustrated in the accompanying drawings.

DESCRIPTION OF THE DRAWINGS

FIGS. 2A, 2B and 2C are idealized line graphs depicting operational parameters of an energy converter for the practice of this invention, in which FIG. 2A shows the absorption parameter versus received energy for the semiconductor material with the p-n junction;

FIG. 2B shows the absorption characteristic for the window material adjacent to the p-n junction; and FIG. 2C shows the nature of the idealized output photocurrent for applied energy for the materials of the solar cell of FIGS. 2A and 2B.

EMBODIMENT OF THE INVENTION

Figure 1:
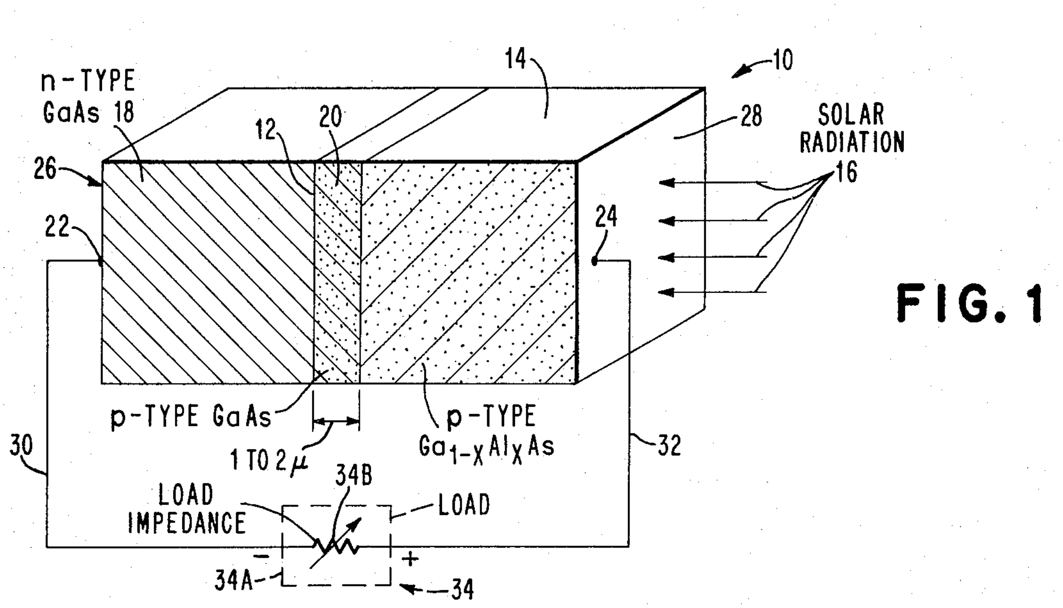
FIG. 1 is a schematic view illustrating an energy converter according to this invention.

FIG. 1 shows a structure 10 for efficient conversion of solar energy into electrical energy. A GaAs p-n junction 12 is formed extremely close to a "window" 14 which is nearly transparent to solar radiation 16. Region 18 is n-type GaAs. Region 20 is a 1 to 2 micron thick layer of p-type GaAs. The GaAs regions 18 and 20 which are established in GaAs substrate 21 have a band gap of approximately 1.4 ev. The window region 14 is p-type $Ga_{1-x}Al_xAs$ with a band gap as high as possible, i.e., similar to 2 lev. The solar radiation 16 passes through region 14 and is only slightly absorbed. When the radiation 16 enters region 20, it is highly absorbed thereby generating hole-electrOn pairs. The generated hole-electron pairs are within a diffusion length for minority carriers, i.e., holes, of the p-n junction 12 to provide an efficient solar cell. Region 14 also acts as a cosmic radiation shield for space application of the solar cell 10 which protects the GaAs p-n junction 12. The window region 14 also acts as a filter to preclude electromagnetic radiation of energy greater than the band gap thereof of approximately 2.1 eV. Ohmic contacts 22 and 24 are established on the surface 26 and 28 of GaAs region 18 and $Ga_{1-x}Al_xAs$ region 14, respectively. Ohmic contact 24 is a small area contact compared to the area of surface 28 of region 14 to permit passage of maximum amount of radiation 16 to the region 20. The structure 10 is connected from ohmic contacts 26 and 28 via conductors 30 and 32, respectively, to a load 34. The load 34A has the optimum impedance for maximum power transfer from the solar cell structure 10 when used as a power source. In order to obtain the operational parameters of the solar cell 10, the load impedance 34A is replaced by a variable resistance 34B.

Illustratively, alternative materials can be used for the solar cell of the drawing; e.g., n-type InP for region 18, p-type InP for region 20 and p-type GaP for region 14.

Figure 2A:
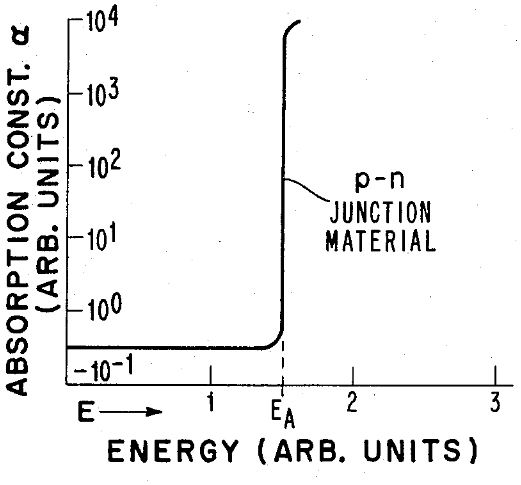
Figure 2B:
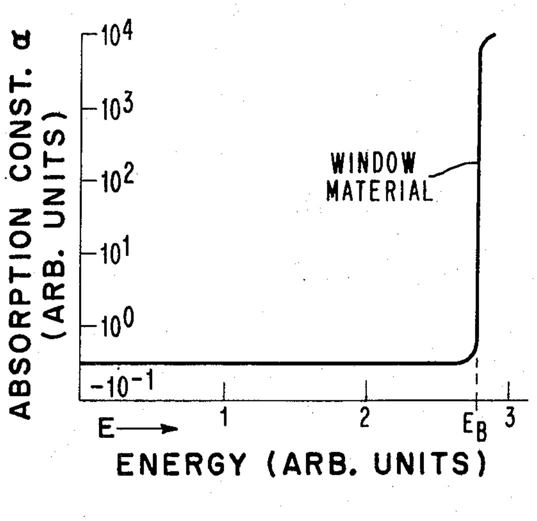
Figure 2C:
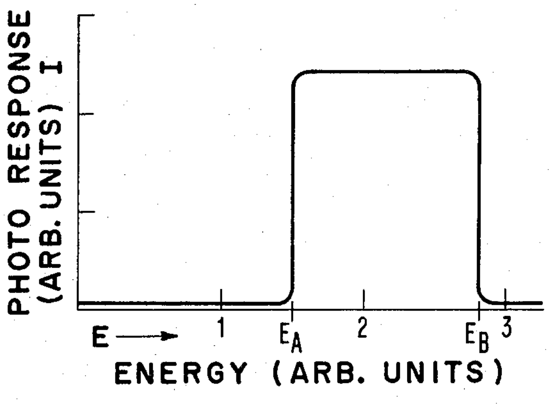

FIG. 2A illustrates the idealized absorption characteristic of GaAs for different energies of the incoming electromagnetic radiation 16 and FIG. 2B illustrates the idealized absorption characteristic of $Ga_{1-x}Al_xAs$ for the incoming electromagnetic radiation 16. It is observed for FIG. 2A that for energy less than $E_A$, the radiation is transmitted, and for energy greater than $E_A$ the radiation is absorbed. Further, for FIG. 2B, when the energy is less than $E_B$, the incident radiation is transmitted and when the energy is greater than $E_B$ the radiation is absorbed. FIG. 2C illustrates the idealized photocurrent response versus energy of incident radiation provided by a photosensitive device of this invention. The band edge at $E_A$ is approximately 1.4 eV and the band edge at $E_B$ is approximately 2.1 eV.

The converter of radiant energy to electrical power provided by the practice of this invention is capable in embodiments thereof of simulating the light conversion property of the human eye to electrical impulses. The infrared band edge sensitivity of the human eye is approximately 1.7 eV and the ultraviolet band edge sensitivity of the human eye is approximately 2.8 eV.

In general, the device of FIG. 1, which has been described above for an illustrative embodiment, is for the practice of this invention such that regions 18 and 20 are of the same material but of opposite conductivity types and of band gap energy less than semiconductor region 14 which has the same conductivity type as region 20. This device is capable of photoresponses for radiant energies which lie between the band gap energies of regions 20 and 14.

Figure 3C:
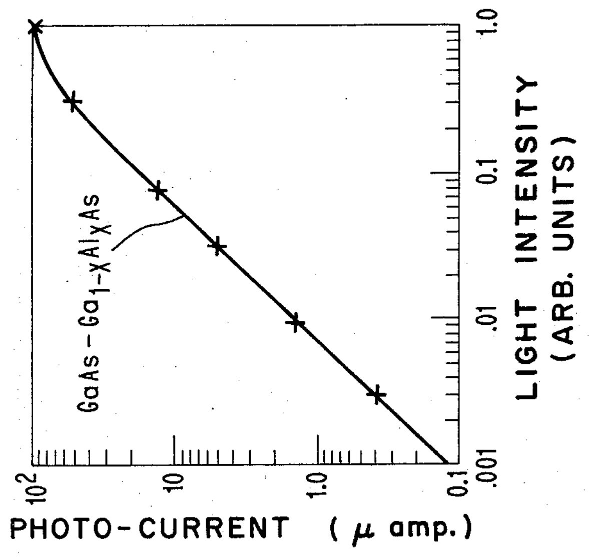
FIG. 3C shows a log-log plot of photocurrent through a load resistor connected to an exemplary GaAs solar cell in accordance with this invention versus test light intensity at 8,000 A.
Figure 3B:
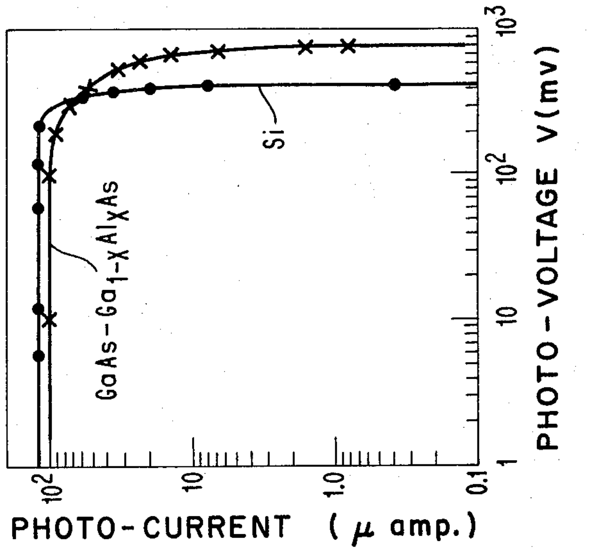
FIG. 3B shows a log-log plot of current versus voltage for various test load resistors of an exemplary GaAs solar cell device in accordance with this invention compared with a Si solar cell of the same area.
Figure 3A:
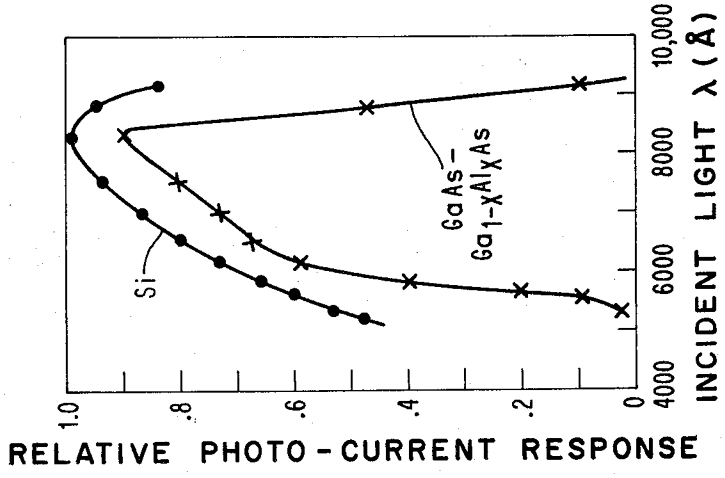
FIG. 3A shows the relative photocurrent response versus the wavelength of the solar light incident on cell in angstroms for an exemplary GaAs cell in accordance with this invention and for an Si cell of comparable area.

FIG. 3A shows the relative photocurrent response versus the wavelength of the solar light incident on cell in angstrom units for an exemplary GaAs cell device 10 in accordance with this invention and for a Si cell, not shown, of comparable areas under a particular operational circumstance. The sharp decrease in response at wavelengths less than 6,000 A is due to the light absorption by the $Ga_{1-x}Al_xAs$ p-type window 14. It should also be noted that the comparable Si solar cell has a larger photocurrent response at wavelengths longer than 9000A than does the GaAs device. However, the smaller photocurrent exhibited by the exemplary GaAs device is offset by the larger voltage which it can generate which makes it an efficient power converter.

FIG. 3B shows a log-log plot of current versus voltage output of an exemplary GaAs solar cell device in accordance with this invention compared with the output of a Si solar cell of the same area. Although the current at low voltages through the Si device is greater than that through the GaAs device, the voltage developed by the GaAs device at higher current is greater than that for the Si cell. Thus, the power which can be delivered by both devices is comparable.

FIG. 3C shows a log-log plot of photocurrent through a given load resistor connected to an exemplary GaAs solar cell in accordance with this invention versus light intensity at 8,000 A. The photocurrent is linear with intensity for almost 3 decades of illumination.

PRACTICE OF THE INVENTION

A structure for the practice of this invention can be obtained by growing a layer of $Ga_{1-x}Al_xAs$ onto a GaAs n-type substrate by the method of liquid phase epitaxy of copending application Ser. No. 646,315 by H. S. Rupprecht and J. S. Woodall, filed June 15, 1967, and assigned to the assignee hereof and incorporated herein by reference. Doping levels between $10^{16}$ and $2 \times 10^{18}$ atom/cc are used in growth of the structure 10 (FIG. 1) from a melt containing 20 gms. Ga; 2.5 gms to 4 gms GaAs; 0.020 to 0.400 gms Zn, 0 to 0.200 gms Al. The cooling rate is selected between 0.5° C/min and 4° C/min, and growth temperature decreases in the range from 990° to 930° C. Exemplary structures have been obtained for a GaAs n-type substrate doped at $2 \times 10^{17}$ Si atoms/cc with a p-type $Ga_{1-x}$AlaxAs layer grown thereon from a melt of 20 gms Ga, 3.0 gms GaAs; 0.150 gms Al, 0.040 gms Zn and grown between 990° and 930° C with cooling at 0.5° C/min. This structure can convert 30 percent more power than a standard Si solar cell of the same dimension. The structure has a p-n junction 12 in the GaAs substrate 26 located at 2 microns from the $Ga_{1-x}Al_xAs$ GaAs interface. This junction can be made at approximately 7 microns from the interface when the Zn concentration is charged to 0.400 gms and the $Ga_{1-x}Al_xAs$ layer is grown between 990° C and 940° C and cooled at a rate of 2° C/min.

FABRICATION OF THE INVENTION

The layer of $Ga_{1-x}Al_xAs$ on GaAs of a solar cell according to this invention substrate is illustratively accomplished by liquid phase epitaxy as set forth in the noted copending application Ser. No. 646,315.

Figure 4:
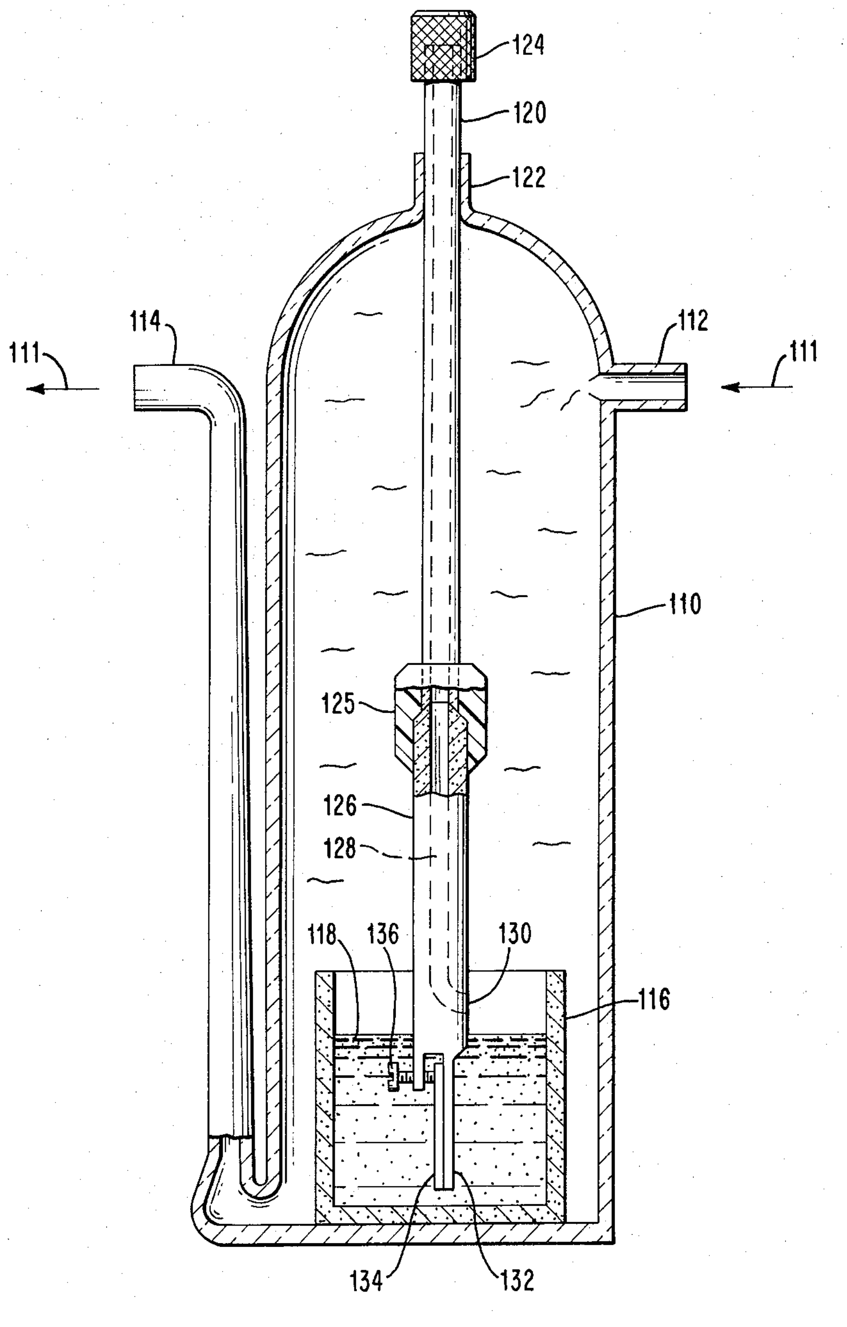
FIG. 4 shows a schematic diagram of the apparatus used for the liquid phase epitaxial growth of a $Ga_{1-x}Al_xAs$ window layer on a GaAs substrate for a solar cell in accordance with this invention.

FIG. 4 is a schematic diagram of apparatus in accordance with the noted copending application suitable for growing a semiconductor crystal compound by liquid phase epitaxy. Quartz chamber 110 is provided within which the preparation of the compound is obtained. Orifice 112 is the inlet for a high purity inert gas used during the steps of the procedure according to this invention. After having served its intended purpose during the steps of the procedure of this invention, the inert gas introduced via orifice 112 exits from chamber 110 via orifice 114. A crucible 116 of $Al_2O_3$ is established within chamber 110, the components of the desired window, e.g. for $Ga_{1-x}$AlaxAs, the components of the ternary compound, Ga, Al, and As are established as a liquid in equilibrium at a given temperature in the crucible 116. The heat source whereby the liquid 118 is raised in temperature and the heat sink whereby the temperature of liquid 118 is lowered are not shown. For convenience, a vertical tubular electric furnace with temperature control can be used for both the heat source and heat sink, and the ambient environment providing sufficient temperature for cooling. Quartz tube 120 is introduced into chamber 110 via orifice 122. Removable cap 124 is placed on top of tube 120. Quartz tube 120 is connected by coupling 125 to a graphite piece 126 which has a tube portion 128 therein connecting to the tube portion of tube 120. Orifice 130 of tube 128 exits just about the surface of liquid 118. Graphite portion 126 is machined to have a lower extending portion 132 upon which a solid substrate, e.g., single crystalline GaAs layer 134, comparable to GaAs substrate 21 of FIG. 1, is affixed by the thrust of screw 136.

A crucible 116 is selected which does not react with the components of the liquid 118 at the temperature of growth of the crystalline compound according to the practice of the invention. A suitable pressure of the inert gas 111 introduced at orifice 112 is maintained in chamber 110 to inhibit vapor formation of highly volatile components in the liquid 118 and further to preclude any undesirable reactions in the liquid 118 with contaminants that might otherwise be introduced into chamber 110. Illustrative inert gases suitable for the gas 111 are argon and helium. Another gas which is inert for the liquid 118 consisting of the components Ga, Al and As, is high purity forming gas, e.g., 10% $H_2$ + 90% $N_2$.

In an illustrative operation for growing a layer of $Ga_{1-x}Al_xAs$, comparable to layer 14 of FIG. 1, crucible 116 is loaded with the components Ga, Al and As for a suitable liquid in equilibrium at a given temperature, e.g., 20 grams Ga, 0.150 grams Al, 3.0 grams pure GaAs, and 0.040 grams of determining p-type dopant Zn.

The crucible 116 is introduced in chamber 110 through a port, not shown. The quartz tube 120, and graphite portion 126 are coupled via connection 127. A substrate 134 of n-type GaAs doped with Si, with the surface main face perpendicular to the < 100 >crystalline direction is affixed to the extending portion 132 and the composite structure of tube 120, graphite portion 126 and GaAs substrate 134 is established in chamber 110 above liquid 118. The chamber 110 is flushed with inert gas 111 and a suitable pressure thereof is maintained in the chamber. The entire chamber 110 is placed into an isothermal furnace maintained at a given temperature for equilibrium of the liquid 118, e.g., 950° C. A suitable time is permitted to elapse so that the liquid 18 achieves equilibrium at the given isothermal temperature, e.g., 30 minutes. Substrate 134 is then immersed in the liquid 118 and a period of time is allowed to elapse so that the substrate 134 achieves equilibrium with the liquid 118 at the operational temperature. Conveniently, temperature of liquid 118 can be lowered slightly before introducing the substrate 134, e.g., lowering by 20° C, and after the substrate 134 has been introduced into the liquid 118 the temperature is raised somewhat, e.g., by 10°, so that the temperature at which the initiation of the growth is to occur is at a preselected temperature, e.g., 950° C. The raising of the temperature by 10° C also results in good wetting of the melt to the GaAs substrate 134. For a uniform composition of a grown layer of $Ga_{1-x}Al_xAs$ on substrate 134, a particular cooling rate is selected, e.g., from 0.5° C per minute, and the cooling at this rate is continued to 930° C until a required layer of thickness of the crystalline compound is obtained. As a result of this growth schedule, the zinc diffuses into the GaAs in such a manner to form a p-n junction, comparable to the p-n junction 12 of FIG. 1, 1 to 2 microns from the GaAs optical surface. The depth of the p-n junction can be further increased by subsequent heat treatment if required for certain operational circumstances in the practice of this invention.

This structure can now be formed into devices, comparable to device 10 of FIG. 1, by forming square or rectangular pieces by conventional cleaving or sawing procedures. An individual piece is then electrically contacted by alloying ohmic contacts, comparable to ohmic contacts 26 and 28 of FIG. 1, at the device surfaces. The ohmic contact on the $Ga_{1-x}Al_xAs$ window surface should be made as small as possible to allow the maximum amount of incident radiation to penetrate the device. Suitable ohmic contact materials are Sn-Au alloys for the n-type GaAs and Au or Au-In alloys for the p-type $Ga_{1-x}Al_xAs$ window..

SUMMARY

Theoretically, GaAs is a more efficient material than Si for power conversion of solar radiation. However, in practice, GaAs solar cells of the prior art have at best operated at about 50 percent of theoretical efficiency which is due in part to a very short minority carrier lifetime. The short minority carrier lifetime requires the fabrication of a p-n junction which is located about 1 to 2 microns from the surface of the device to optimize efficiency. Conventional diffusion techniques are generally incapable of producing such structures and in the prior art, Si has been the preferred practical material for optimum solar cells. However, a Si solar cell device is susceptible to radiation damage caused by high energy cosmic particles and the cells are usually glass coated to prevent such damage. In contrast, GaAs cells of this invention are more radiation damage resistant, which is an important characteristic when comparing power per weight ratios of comparable cells.

This invention provides a reliable method for forming a p-n junction in a wafer of GaAs which is close to the wafer surface and also forms a protective window which is substantially transparent to solar radiation. In the practice of this invention, a p-type layer of $Ga_xAl_{1-x}As$ with a band gap of approximately 2.1 eV is grown onto an n-type GaAs substrate with a band gap of approximately 1.4 eV. During fabrication of the device, the p-type dopant in the $Ga_xAl_{1-x}As$ layer diffuses into the GaAs substrate thus forming a p-n junction in the GaAs near the growth of interface. Illustratively, such structures produce 30 percent more power from solar radiation than a standard Si cell of the same dimensions. Since the window layer of $Ga_{1-x}Al_xAs$ of a solar cell according to this invention acts as a shield for undesired radiation and an electrical contact path to the GaAs p-n junction, the weight is less than for a comparable Si device which requires separate components to serve these functions.

What is claimed is:

1. An energy converter for converting radiant energy to electrical power comprising:
   - a first semiconductor GaAs material having a p-n junction therein proximate to an optical surface thereof;
   - a window layer of second semiconductor $Ga_{1-x}Al_xAs$ material adjacent to said optical surface and adapted to receive radiant energy; and
   - utilization means for electrical power connected in electrical series path relationship to said first semiconductor material and said second semiconductor material.

2. An energy detector for electromagnetic energy comprising:
   - a first semiconductor GaAs material having a p-n junction therein proximate to an optical surface thereof;
   - a window of second semiconductor $Ga_{1-x}Al_xAs$ material contiguous to said optical surface and adapted to receive electromagnetic energy; and
   - detection means connected in series path to said first semiconductor material and said second semiconductor material for detecting electromagnetic energy.

3. A detector for radiant energy comprising:

a region of GaAs including a zone of p-type GaAs adjacent to a zone of n-type GaAs and forming a p-n junction therebetween proximate to an optical surface of said p-type GaAs:

a window layer of p-type $Ga_{1-x}Al_xAs$ adjacent to said optical surface of said p-type GaAs, said window layer being preferentially doped to transmit selected radiant energies incident thereon and to transmit other selected radiant energies incident thereon to said p-type GaAs, and electrical series path means connected ohmically to said n-type GaAs and to said $Ga_{1-x}Al_xAs$ window layer for detecting said transmitted selected radiant energies.

4. A detector for electromagnetic energy having a first absorption limitation proximate to an infrared band limitation and a second absorption limitation proximate an ultraviolet band limitation comprising:

a first layer of binary semiconductor GaAs compound with a p-n junction therein, said binary semiconductor compound having an optical surface thereon;

a second layer of a ternary semiconductor $Ga_{1-x}Al_xAs$ compound adjacent to said optical surface;

said ternary semiconductor compound having an absorption limitation proximate to said infrared band limitation and said ternary semiconductor compound having an absorption limitation proximate to said ultraviolet band limitation; and electrical circuit means in series path relationship to said first and second layers for detecting electromagnetic energy incident on said ternary semiconductor compound.

5. A solar radiation cell comprising:

a region of n-type GaAs with a n-type dopant concentration of approximately between $10^{16}$ and $10^{18}$ atoms/cc and a region of p-type GaAs with a p-type dopant concentration of greater than said n-type dopant concentration;

a window layer of $Ga_{1-x}Al_xAs$ adjacent to an optical surface of said p-type GaAs in said optical surface being approximately in the range 1 to 10 microns distance of said p-n junction in said GaAs, and being selectively doped with p-type dopant of selected concentration to absorb cosmic radiation in said solar radiation and to transmit electromagnetic radiation therein to said p-type GaAs and load impedance means connected ohmically in series path relationship to said n-type GaAs and said $Ga_{1-x}Al_xAs$ with substantially optimum impedance for substantially maximum power transfer from said semiconductor materials to said load impedance.

6. An energy converter for converting radiant energy to electrical power comprising:

a region of n-type GaAs with an n-type dopant concentration of approximately between $10^{16}$ and $10^{18}$ atoms/cc and a region of p-type GaAs with a p-type dopant concentration of greater than said n-type dopant concentration;

a window layer of p-type $Ga_{1-x}Al_xAs$ adjacent to an optical surface of said p-type GaAs in said optical surface being approximately in the range 1 to 10 microns distance of said p-n junction in said GaAs; and load impedance means connected ohmically in series path relationship to said n-type GaAs and said $Ga_{1-x}Al_xAs$ with substantially optimum impedance for substantially maximum power transfer from said semiconductor materials to said load impedance.

* * * * *